United States Patent [19]
Komatsu et al.

[11] Patent Number: 5,572,325
[45] Date of Patent: * Nov. 5, 1996

[54] APPARATUS FOR OPTICALLY DETECTING A POSITION OF MARK

[75] Inventors: Kouichiro Komatsu, Tokyo; Masashi Tanaka, Kanagawa, Japan

[73] Assignee: Nikon Corporation, Tokyo, Japan

[*] Notice: The term of this patent shall not extend beyond the expiration date of Pat. No. 5,483,348.

[21] Appl. No.: 467,677

[22] Filed: Jun. 6, 1995

Related U.S. Application Data

[63] Continuation of Ser. No. 344,613, Nov. 18, 1994, Pat. No. 5,483,348, which is a continuation of Ser. No. 945,330, Sep. 16, 1992, abandoned.

[30] Foreign Application Priority Data

Sep. 17, 1991 [JP] Japan ................................ 3-262550

[51] Int. Cl.⁶ ............................................. G01B 11/00
[52] U.S. Cl. .............................................. 356/401; 250/548
[58] Field of Search .................................. 356/375, 399, 356/400, 401; 250/548

[56] References Cited

U.S. PATENT DOCUMENTS

| | | | |
|---|---|---|---|
| 4,405,229 | 9/1983 | Mayer | 355/77 |
| 5,150,173 | 9/1992 | Isobe et al. | 356/401 |
| 5,483,348 | 1/1996 | Kamatsu et al. | 356/401 |

FOREIGN PATENT DOCUMENTS 4-157470   5/1992   Japan.

*Primary Examiner*—F. L. Evans
*Attorney, Agent, or Firm*—Keck, Mahin & Cate

[57] ABSTRACT

A position detecting apparatus for optically observing an opaque mark formed on a transparent substrate to detect a position of the mark with a high degree of accuracy. The apparatus includes a detection optical system for forming a detected image of the mark, an illumination system for supplying an illuminating light to the mark through an objective lens of the detection optical system, projection means arranged to face the detection optical system through the substrate and forming a conjugate position to the mark, and reflecting means which is settable substantially at the conjugate position. The image of the mark can be detected as either a bright image or a dark image under the conditions where there are a sufficient contrast between the mark and the background and a uniform background density. The shape of the mark and the arrangement of patterns around the mark can be determined as desired.

12 Claims, 10 Drawing Sheets

1

APPARATUS FOR OPTICALLY DETECTING A POSITION OF MARK

This is a continuation application of Ser. No. 08/344,613, filed Nov. 18, 1994, now U.S. Pat. No. 5,483,348, which is a continuation of Ser. No. 07/945,330, filed Sep. 16, 1992, now abandoned.

BACKGROUND OF THE INVENTION

1. Field of the Invention

The present invention relates to an apparatus for optically detecting the position of an opaque mark formed on a transparent substrate. This position detecting apparatus is applicable as a mask alignment apparatus for a projection exposure apparatus (stepper) used in the manufacture of semiconductor devices.

2. Description of the Prior Art

With the recent remarkable improvement in the level of integration of devices such as memory devices in large scale integrated circuits (LSIs), the design line widths of circuit patterns on such devices have reached the levels ranging from 1 μm to 0.5 μm and reduction projection-type projection exposure apparatus (steppers) employing ultraviolet light of a particular short wavelength as its exposure light have been used solely for the purpose. The projection exposure apparatus is such that a mask (reticle) containing a circuit pattern and an exposure specimen (wafer) coated with a light-sensitive material are arranged to oppose each other through a projection optical system whereby after they have been two-dimensionally aligned in a conjugate plane of the projection optical system with respect to the exposure light, the exposure light is irradiated from the backside of the mask and the circuit pattern is photographically transferred onto the exposure specimen.

It is to be noted that a large number of exposure areas of the same pattern are arranged on the ordinary exposure specimen (wafer) whereby the exposure specimen is moved (stepped) and the transfer of the circuit pattern is repeated for every exposure or shot area, thereby completing the processing of the single exposure specimen. Such exposure transfer is repeated a number of times throughout the LSI manufacturing process. As a result, with the projection exposure apparatus employed in the LSI manufacturing process, on one hand, the accuracy of as high as less than 10% of the design line width or 0.05 μm is required for the mask-to-exposure specimen alignment accuracy (the alignment accuracy for the transferred image of the circuit pattern and the exposure area) for every exposure transfer and, on the other hand, it is required that the required alignment time per exposure specimen is reduced so as to improve the efficiency as the manufacturing apparatus. To improve the accuracy and efficiency concerning the mask-to-exposure specimen alignment is one of the important technical problems encountered in the projection exposure apparatus.

As the projection exposure apparatus of the type which simultaneously satisfies the desired alignment accuracy and efficiency, an apparatus of the type in which a mask and an exposure specimen are separately aligned with respect to a projection optical system (or the projection exposure apparatus) has been put in practical use. In this apparatus, a mask is mounted on an X-Y stage provided with a precision measuring device (interferometer whereby while illuminating position detecting opaque marks formed on a transparent mask substrate and detecting detection images due to the reflected light from the marks by photoelectric detectors thereby checking the positions of the marks, the mask is moved by the X-Y stage and the mask is positioned with respect to the projection optical system (or the projection exposure apparatus). Then, an X-Y stage for carrying the exposure specimen thereon is positioned with respect to the projection optical system (or the projection exposure apparatus) by use of a position detecting system for the X-Y stage and a position detecting system for the exposure areas on the exposure specimen. Then, according to this arrangement, the respective exposure areas are successively fed mechanically to the position of the transferred image of the circuit pattern.

At this time, the position detecting marks formed on the mask are usually formed, along with the circuit pattern, by selectively removing a thin film of opaque chromium formed on a transparent glass substrate by etching. There are instances where such marks are subjected to a treatment such as a coating for reflection reducing purposes. Thus, it is difficult to optically detect the reflected images of the marks subjected to the reflection reducing treatment.

In this case, while it is conceivable to arrange a reflective surface in the mark transmission direction (the opposite direction to the illumination light source), in this case the light transmitted through around each mark is reflected by the reflective surface and thus a defocused negative mark image is formed on the mark. As a result, there is a problem that the blurred mark image is superposed around each mark and thus the mark position detection accuracy is deteriorated.

Then, in accordance with manufacturing processes a variety of masks including a mask subjected to a reflection reducing treatment, the ordinary mask, etc., are used. When effecting the position detection of these masks, there is a problem that the variation of the reflectance with respect to the position detecting illuminating light is as large as from 10to 70%.

SUMMARY OF THE INVENTION

It is a first object of the present invention to provide an optical position detecting apparatus capable of detecting the position of a mask with a high degree of accuracy.

It is a second object of the present invention to provide an optical position detecting apparatus capable of highly accurately detecting the position of a mark without having recourse to any reflection from the mark.

To accomplish the above objects, in accordance with one aspect of the present invention there is thus provided an optical position detecting apparatus for detecting the position of a mark formed on an object to be detected, and the apparatus includes light source means for supplying light, an illumination optical system for directing the light from the light source means to the mark, reflecting means having a given reflectance, optical means for projecting an image of the mark illuminated by the light onto the reflecting means, and detecting means for detecting the image of the mark in accordance with a first light reflected by the mark and a second light reflected by the reflecting means.

In accordance with another aspect of the present invention there is provided an optical position detecting means for detecting the position of a first object when projecting a pattern on the first object onto a second object through a projection lens, and the apparatus includes light source means for supplying light, an illumination optical system adapted for directing the light from the light source means to at least one mark on the first object, moving means for moving the second object within a plane conjugate to the first object with respect to the projection lens, reflecting means provided on the moving means to reflect the light transmitted through the mark, and detecting means for receiving a first light reflected by the mark and a second light reflected by the reflecting means to detect the image of the mark.

In accordance with still another aspect of the present invention there is provided an optical position detecting apparatus for detecting the position of a first object when projecting the pattern on the first object on a second object through a projection lens, and the apparatus includes moving means for moving the first object, light source means for supplying light, an illumination optical system for directing the light from the light source means to at least one given mark on the first object through an objective lens, reflecting means including a plurality of reflective surfaces which are different in reflectance from each other and provided on the moving means, a detecting optical system for forming an image of the mark by the light from the mark through the objective lens, a detector for photoelectrically converting the image of the mark to generate a detection signal, and control means responsive to the detection signal from the detector to control the moving means in such a manner that the position of the first object attains a given position.

In accordance with still another aspect of the present invention there is provided an optical position detecting apparatus for detecting the relative positions of a first object and a second object when projecting a pattern formed on the first object onto the second object through a projection lens, and the apparatus includes first moving means for moving the first object, second moving means for moving the second object within a plane conjugate to the first object with respect to the projection lens, light source means for supplying light, an illumination optical system for directing the light from the light source means to at least one given first mark formed on the first object, first detecting means for detecting an image of the first mark in accordance with light reflected by the first mark, reflecting means including a reflective member for reflecting the image of the first mark and a second mark arranged at a given spacing from the reflective member and provided on the second moving means, second detecting means for photo-electrically detecting the position of the second mark, and control means responsive to the detection signal from the first detecting means to control the first moving means and responsive to the detection signal from the second detecting means to control the second moving means.

In the optical position detecting apparatus according to the present invention, the mark formed on the object to be detected and the reflecting means for reflecting the illuminating light passed around the mark back to the mark are arranged in a conjugate relation by the optical means. By virtue of this construction, the light passed around the mark goes and returns through the optical means and it forms on the mark its negative image which coincides with the mark. Thus, in accordance with the optical position detecting apparatus of the present invention no mark shade in produced and the position of the mark can be detected with a high degree of accuracy.

In addition, with the optical position detecting apparatus of the present invention based on the above-mentioned construction, it is preferable that the reflectance of the reflecting means is made variable and that the change-over is made possible between the plurality of reflective surfaces of the reflecting means which are different in reflectance from each other, thereby making it possible to vary the brightness of the background light for the mark.

In this case, it is preferable that when the reflectance of the mark is high, the reflectance of the reflecting means is decreased to decrease the brightness of the background for the mark and thereby to detect the mark. On the contrary, when the reflectance of the mark is low, the reflectance of the reflecting means should preferably be increased to increase the brightness of the background for the mark and thereby to detect the mark. By employing this construction, it is possible to maintain the desired high contrast to detect an image of the mark formed on the object to be detected irrespective of the reflectance of the mark, thereby improving the accuracy of mark position detection.

The above and other objects, features and advantages of the present invention will become fully apparent from the following description of its preferred embodiments taken in conjunction with the accompanying drawings.

DESCRIPTION OF THE PREFERRED EMBODIMENTS

Figure 1:
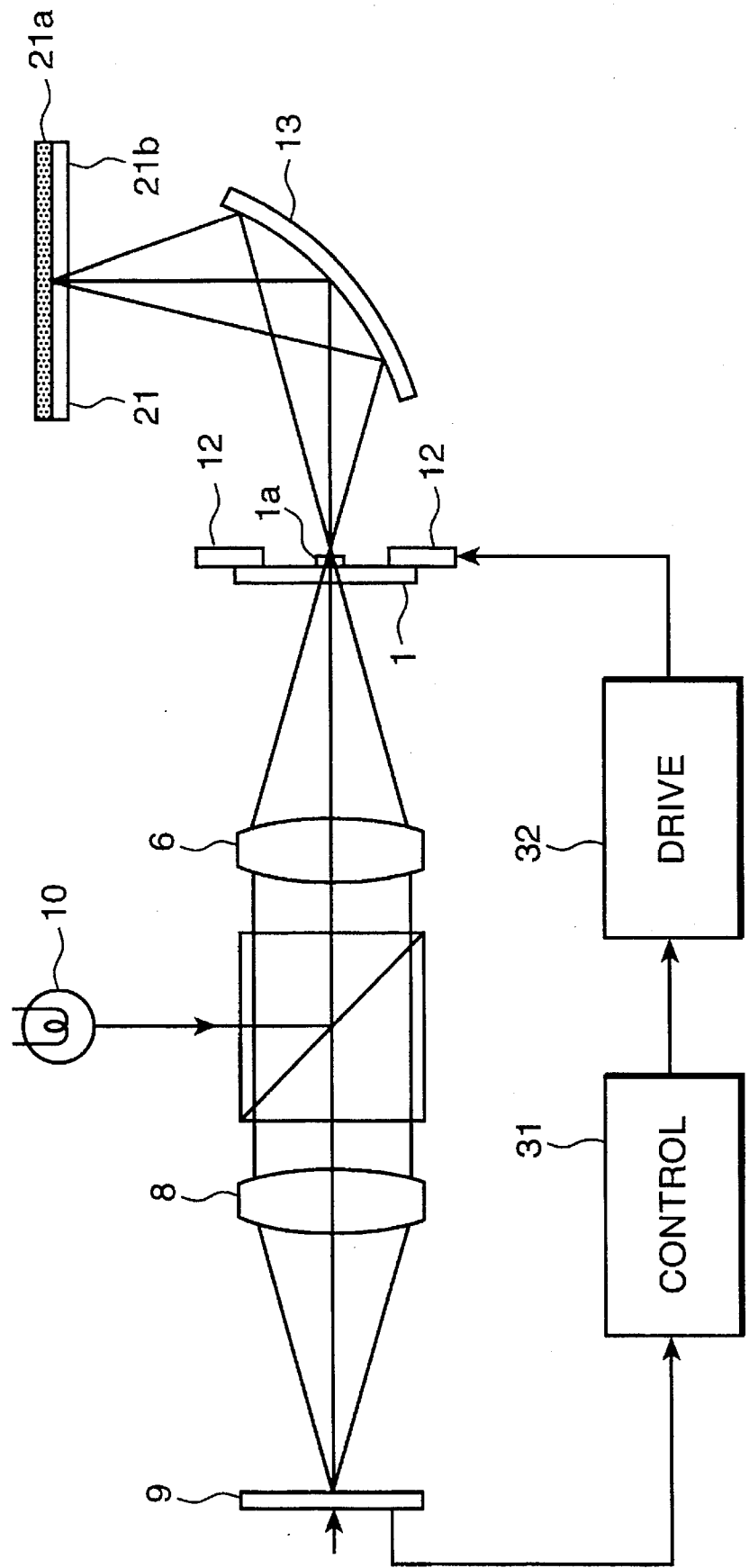
FIG. 1 shows the construction of principal parts of a position detecting apparatus according to a first embodiment of the present invention.

A first embodiment of the present invention will now be described first with reference to FIG. 1 showing schematically an example of a position detecting apparatus according to the present invention.

With the position detecting apparatus shown in FIG. 1, the image of a mark 1a in the form of a light shielding pattern of a thin film of chromium or the like formed on an object to be detected or a transparent glass plate is detected and the position of the mark 1a is measured. Then, in accordance with the result of the measurement, a drive system 32 for moving a stage 12 carrying the object 1 thereon is operated so that the object 1 is moved and its alignment is effected.

Then, in this position detecting apparatus the illuminating light supplied from a light source 10 illuminates the mark 1a through a half prism 7 and an objective lens 6.

At this time, the light reflected by the surface of the mark 1a is directed to the objective lens 6 so that the reflected light is passed through the objective lens 6, the half prism 7 and a condenser lens 8 in this order and an image of the mark 1a is formed on a detector 9 of the CCD type or the like. The detector 9 detects the image of the mark 1a.

On the other hand, the light passed around the mark 1a forms an image of the mark 1a on a variable reflectance mirror 21 through a concave mirror 13 forming optical means on the transmission side of the mark 1a. Then, the light is reflected by the variable reflectance mirror 21 to arrive again at the mark 1a through the concave mirror 13. In this case, since the mark 1a and the variable reflectance mirror 21 are arranged in a conjugate relation with respect to the concave mirror 13, the image of the mark 1a produced by the light returned as the result of the reflection from the variable reflectance mirror 21 is superposed in a condition which coincides with the original mark 1a. In the discussion to follow, the light which passed around the mark 1a, goes the both ways through the concave mirror 13 and arrives again at the mark 1a is referred to as a background light. This background light forms an image of the mark 1a on the detector 9 through the objective lens 6, the half prism 7 and the condenser lens 8.

Then, in order to measure the position of the mark 1a in accordance with its image detected by the detector 9 and thereby to effect the alignment of the mask 1, a control system 31 operates the drive system 32 to move the stage 12 carrying the mask 1 thereon.

In this case, the variable reflectance mirror 21 is made by attaching an electrochromic element 21b to the front surface of a plane mirror 21a. The electrochromic element 21b is capable of varying its own light transmittance when an electric signal is transmitted thereto. Thus, the reflectance of the variable reflectance mirror 21 is made variable in this way.

With the position detecting apparatus constructed as described above, when the reflectance of the mark 1a is high, the reflectance of the variable reflectance mirror 21 is decreased to lower the brightness of the background light. When this occurs, due to the light reflected by the mark 1a, a bright image of the mark 1a is formed on the detector 9 under the dark background light and thus the detector 9 can detect the mark image of a high contrast.

On the contrary, when the reflectance of the mark 1a is low, the reflectance of the variable reflectance mirror 21 is increased to increase the brightness of the background light. As a result, a dark image of the mark 1a is formed on the detector 9 under the bright background light and therefore the mark 1a can be detected with a high contrast. It is to be noted that while the concave mirror is used as the optical means in the present embodiment, this optical means may be composed of a lens system.

Next, a second embodiment of the position detecting apparatus according to the present invention which is applied to a projection exposure apparatus by way of example will now be described with reference to FIGS. 2 to 7.

Figure 2:
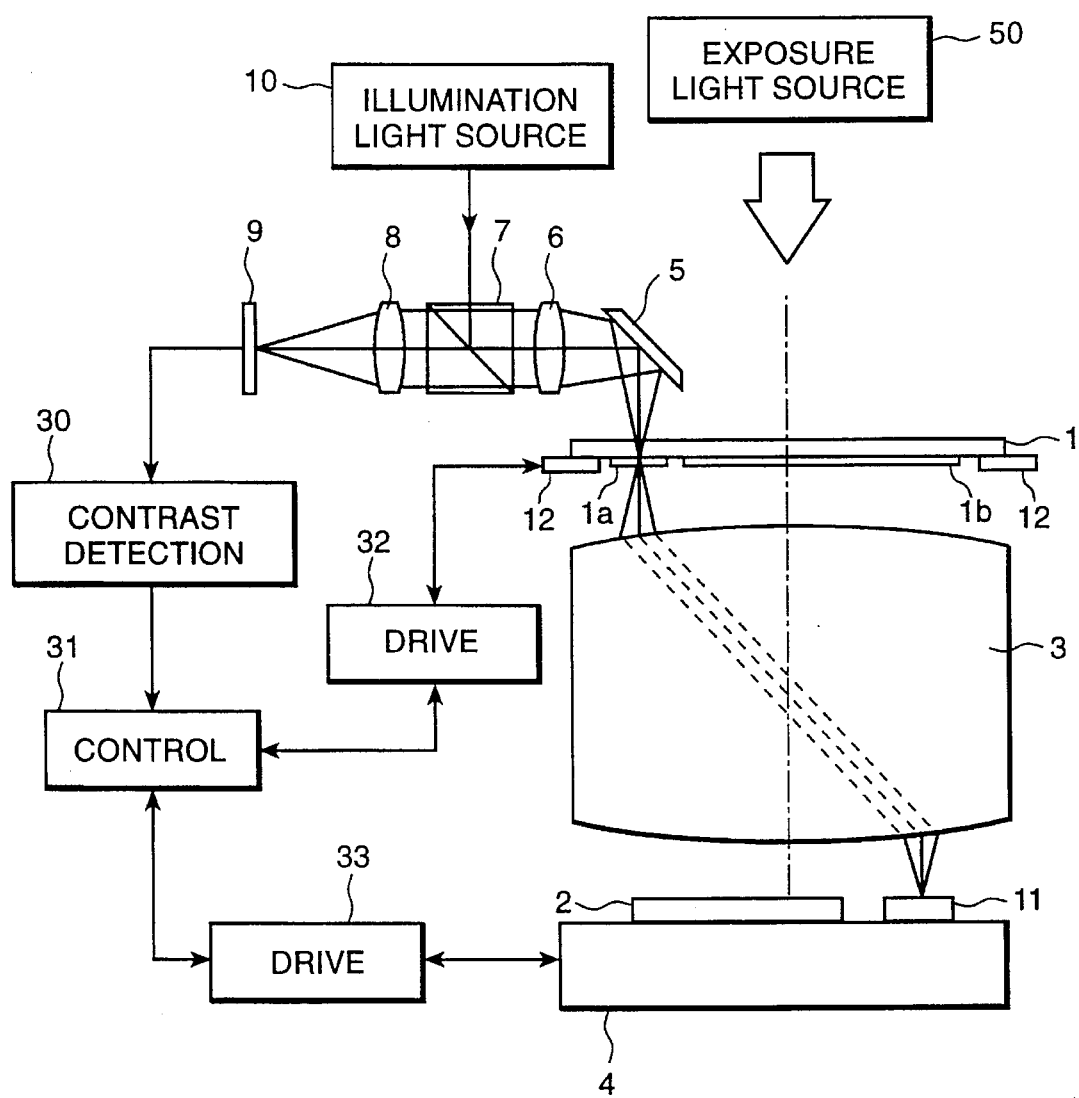
FIG. 2 shows the construction of principal parts of a second embodiment of the position detecting apparatus according to the present invention, which is applied to an exposure apparatus.

In the second embodiment shown in FIG. 2, the optical means of the position detecting apparatus of this invention is used in common by a projection optical system 3 of the projection exposure apparatus and the projection optical system 3 arranges a mark and reflecting means in a conjugate relation. Also, in the second embodiment an illuminating light for illuminating the mark and the exposure light from an exposure light source 50 have the same wavelength. In addition, a fiducial plate 11 of the same height as a wafer 2 or a substrate to be exposed is mounted at one end of a wafer stage 4 carrying a wafer 2 thereon, and the fiducial plate 11 is formed with two reflective surface groups which are different in reflectance from each other whereby in response to the movement of the wafer stage 4 one or the other of the two reflective surface groups is positioned within the visual fields (detection ranges) of mask position detecting systems thereby changing the brightness of the background for detected images.

In FIG. 2, a mask 1 is formed with a circuit pattern 1b to be projected onto the wafer 2 and a mark 1a made of a light shielding pattern of chromium or the like and arranged outside of the area of the circuit pattern 1b. Then, the mask 1 is loaded on a two-dimensionally movable mask stage 12. A control system 31 controls a drive system 32 including an interferometer adapted for detecting the position of the mask 1 so as to move the mask stage 12.

Also, arranged above the mark 1a formed on the mask 1 is a position detecting system for detecting the position of the mark 1a. In this position detecting system, an illumination light source 10 supplies an illuminating light forming a part of the exposure light from an exposure light source 50. Then, the illuminating light from the illumination light source 10 is reflected by a half prism 7 and passed through an objective lens 6. The light emitted from the objective lens 6 is deflected by about 90 degrees by a reflecting mirror 5 to illuminate the mark 1a.

Thus, the light from the illuminated mark 1a is deflected by about 90 degrees by the reflecting mirror 5 and then passed through the objective lens 6, the half prism 7 and a condenser lens 8 in this order thereby forming an image of the mark 1a on a detector 9. The detector 9 detects the image of the mark 1a.

Figure 3:
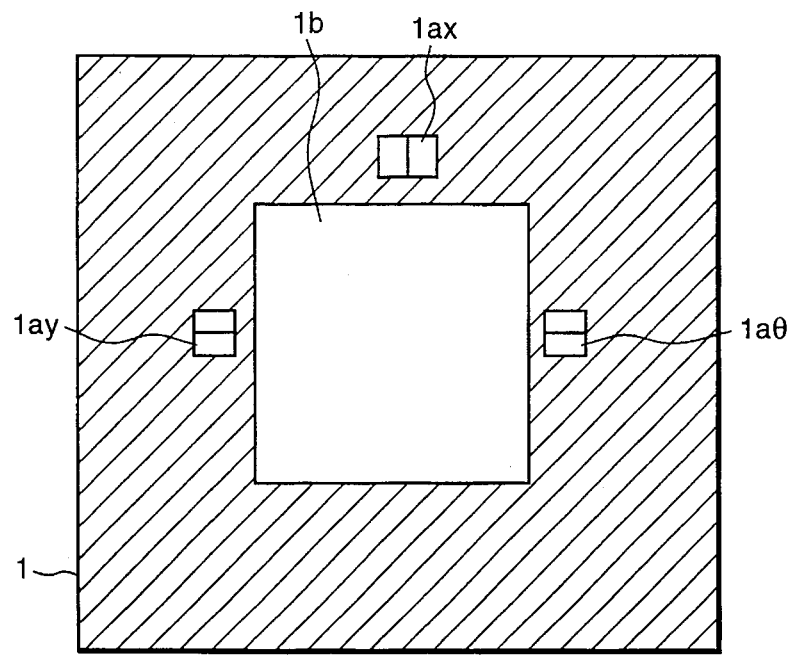
FIG. 3 is a schematic plan view of the mask.

Then, the positional errors of the mask 1 carried on the mask stage 12 include errors in the x and y directions which are perpendicular to each other within the horizontal plane of the mask 1 and a rotational error within the horizontal plane and the measurement of mask positions for these errors requires at least three position measurements within the horizontal plane. In this connection, as shown in FIG. 3, three windows are provided in the hatched light shielding portion around the circuit pattern 1b of the mask 1 and three windows are respectively formed with marks 1ax and 1ay for respectively detecting the positions of the mask surface in the x and y directions and a mark 1aθ for detecting the amount of rotation angle θ of the mask surface.

It is to be noted that the position detecting apparatus of the present embodiment includes three units of the position detecting system (5 to 10) for detecting the marks 1ax, 1ay and 1aθ and FIG. 2 shows only one of the three position detecting systems for purposes of simplifying the description.

Figure 4:
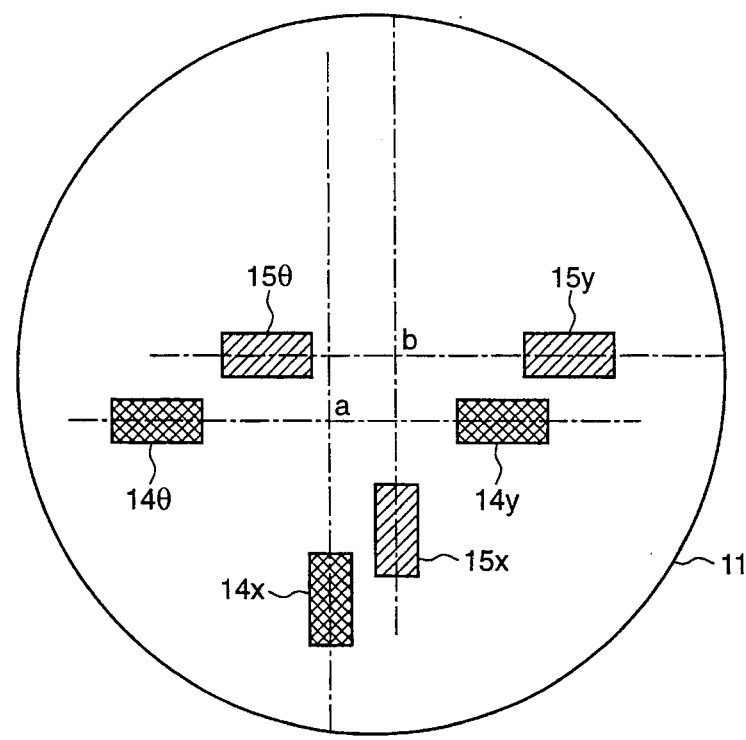
FIG. 4 is a schematic plan view of the fiducial plate.

Now, the two-dimensionally movable wafer stage 4 is moved by a drive system 33 including an interferometer for detecting the position of the wafer and the drive system 33 is controlled by the control system 31. Then, in order to change the brightness of the background within the visual fields of the mask position detecting systems during the mask alignment period, the fiducial plate 11 is provided at one end of the wafer stage 4. As shown in FIG. 4, the fiducial plate 11 is formed with three low reflectance surfaces 14x, 14y and 14θ and three high reflectance surfaces 15x, 15y and 15θ which are respectively corresponding to the three mask marks (1ax, 1ay, 1aθ) for detecting the x-axis, the y-axis and the rotational angle θ, respectively.

In FIG. 4, the fiducial plate 11 is one prepared by forming a thin film of chromium on the upper surface of a transparent glass plate and selectively removing the thin film of chromium by etching thereby forming given patterns. A thin film of aluminum is formed on the high reflectance surfaces 15x, 15y and 15θ to provide them with a reflectance of over 90%. On the other hand, the low reflectance surfaces 14x, 14y and 14θ are formed by removing the thin film of chromium in rectangular patterns and newly applying black paint to the patterns or alternatively their reflectance is kept low by using the glass surface as such and supporting it with metal pieces which are low in light reflectance.

Then, when detecting the mask marks (1ax, 1ay, 1aθ), if the mask marks (1ax, 1ay, 1aθ) are high in reflectance, the wafer stage 4 is moved in such a manner that the optical axis Ax is positioned at a position a where the longitudinal direction passing through the centers of the low reflectance surfaces (14y, 14θ) and the longitudinal direction passing through the center of the low reflectance surface (14x) cross each other as shown in FIG. 4. The respective mask position detecting systems detect the images of the bright mask marks (1ax, 1ay, 1aθ) under the dark background light. This is hereinafter referred to as a dark-field detection.

On the contrary, when the mask marks (1ax, 1ay, 1aθ) are low in reflectance, the position detecting apparatus moves the wafer stage 4 in such a manner that the optical axis Ax is positioned at a position b where the longitudinal direction passing through the centers of the high reflectance surfaces (15y, 15θ) and the longitudinal direction passing through the center of the high reflectance surface (15x) cross each other as shown in FIG. 4. The respective mask position detecting systems detect the images of the dark marks (1ax, 1ay, 1aθ) under the bright background light. This is hereinafter referred to as a bright-field detection.

The change-over between two levels of the brightness of the mark background in accordance with the reflectance of the mask marks (1ax, 1ay, 1aθ) will now be described with reference to FIG. 2.

Firstly, a contrast detection system 30 is responsive to the detection signals from the detectors 9 to detect the contrast condition between the images of the marks 1a and the background light produced by the reflective surfaces of one type on the fiducial plate 11. Thus, if this contrast condition is not satisfactory, the control system 31 operates the drive system 33 in accordance with the detection signal from the contrast detection system 30 so that the wafer stage 4 is moved in such a manner that the reflective surfaces of the other type on the fiducial plate 11 are positioned within the visual fields of the respective mask alignment systems. Thereafter, the control system 31 detects the positions of the mask marks (1ax, 1ay, 1aθ) in accordance with the detection signals from the detectors 9. Then, in accordance with the positions of the mask marks (1ax, 1ay, 1aθ) the control system 31 operates the drive system 32 to move the mask stage 12 in such a manner that the mask 1 is placed in a given position.

It is to be noted that it is possible to use an ITV (industrial television camera) for detecting the image of the mark 1a through the image detection, a photoelectric detection mechanism for detecting a light intensity distribution or the like as the detector 9.

Figure 5:
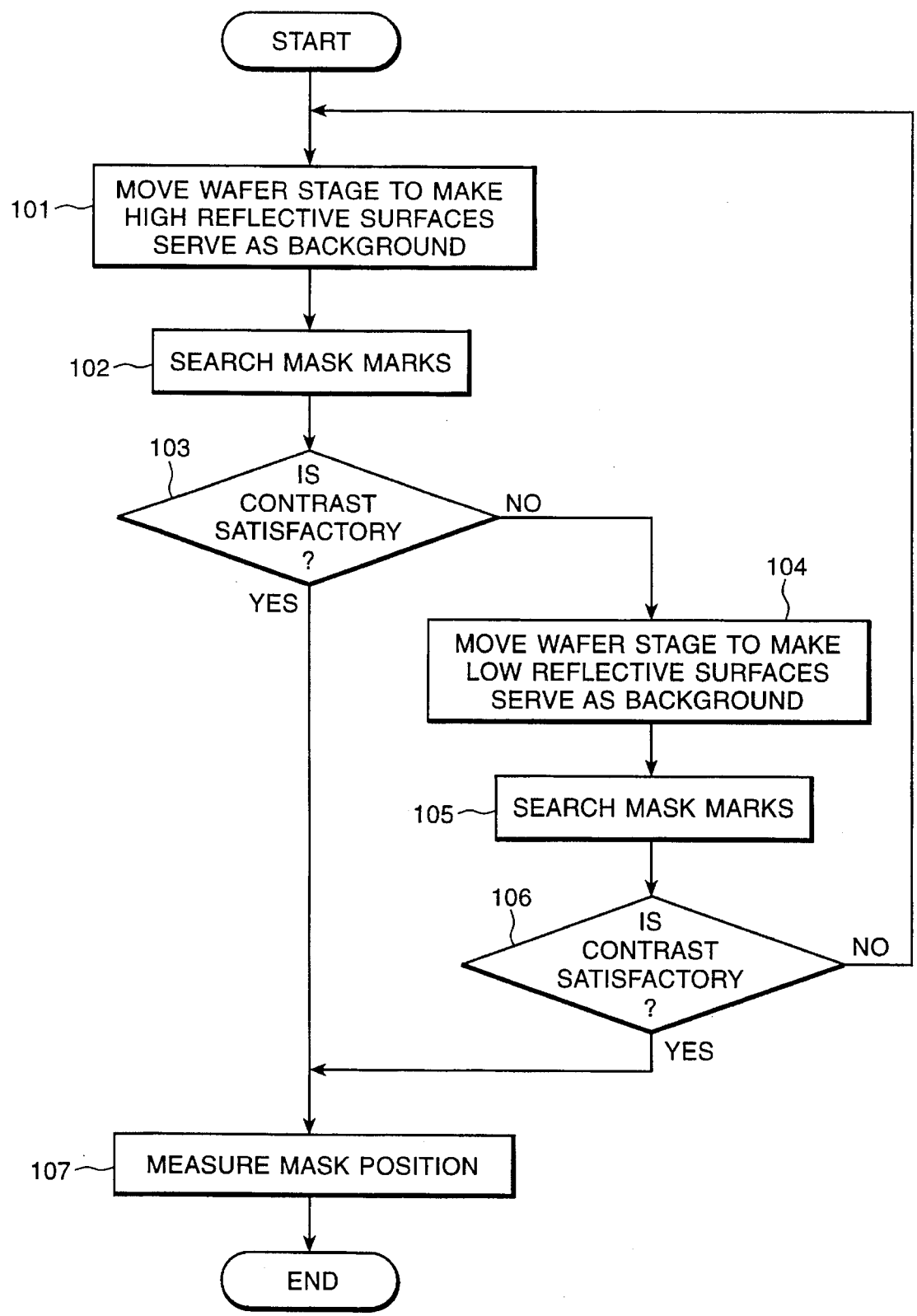
FIG. 5 is a flow chart for the mask alignment operation.

An example of the mask alignment operation will now be described briefly with reference to the flow chart shown in FIG. 5.

(Step 101)
At the step 101, the wafer stage 4 is moved so that the low reflectance surfaces 14x, 14y and 14θ on the fiducial plate 11 are preliminarily positioned within the visual fields of the mask alignment systems and a transfer is made to a step 102.

(Step 102)
At the step 102, the mask stage 12 is moved in such a manner that the mask marks (1ax, 1ay, 1aθ) are respectively positioned within the visual fields of the mask alignment systems and a transfer is made to a step 103.

(Step 103)
At the step 103, the contrast detection system 30 checks the contrast between the images of the mask marks (1ax, 1ay, 1aθ) detected by the detectors 9 and the background light. If the contrast is sufficiently high, a transfer is made to a step 107. On the contrary, if the contrast is not satisfactory, a transfer is made to a step 104.

(Step 104)
At the step 104, the wafer stage 4 is moved in such a manner that the high reflectance surfaces (15x, 15y, 15θ) on the fiducial plate 11 are placed within the visual fields of the mask alignment systems, and a transfer is made to a step 105.

(Step 105)
At the step 105, the mask stage 12 is moved in such a manner that the mask marks (1ax, 1ay, 1aθ) are positioned within the visual fields of the mask alignment systems, and a transfer is made to a step 106.

(Step 106)
At the step 106, the contrast detection system 30 again checks the contrast between the mask marks (1ax, 1ay, 1aθ) detected by the detectors 9 and the background light. Thus, if the contrast is sufficiently high, a transfer is made to the step 107. If the contrast is not satisfactory, a transfer is again made to the step 101.

(Step 107)
At the step 107, the images of the mask marks (1ax, 1ay, 1aθ) detected by the detectors 9 are detected and the positions of the mask marks (1ax, 1ay, 1aθ) are measured.

In this connection, where the low reflectance surfaces are selected, even if the reflectance of the low reflectance surfaces in selected 0%, the reflected light from the glass surfaces on the surfaces of the mask 1 and the fiducial plate 11 are again introduced into the objective lens 6 thereby forming the background of the detected images produced by the reflected light from the mask marks (1ax, 1ay, 1aθ). In this case, if $R_G$ represents the reflectance at the glass surface of the mask, T the transmittance of the projection lens, R the reflectance of the reflecting surface of the fiducial plate 11 and $I_O$ the intensity of the illuminating light, the light intensity $I_B$ of the background of the detected images is given as follows $$I_B = [R_G + (1-R_G) \cdot R_G + (1-R_G)^4 \cdot T^2 \cdot R] \cdot I_O$$

Figure 6:
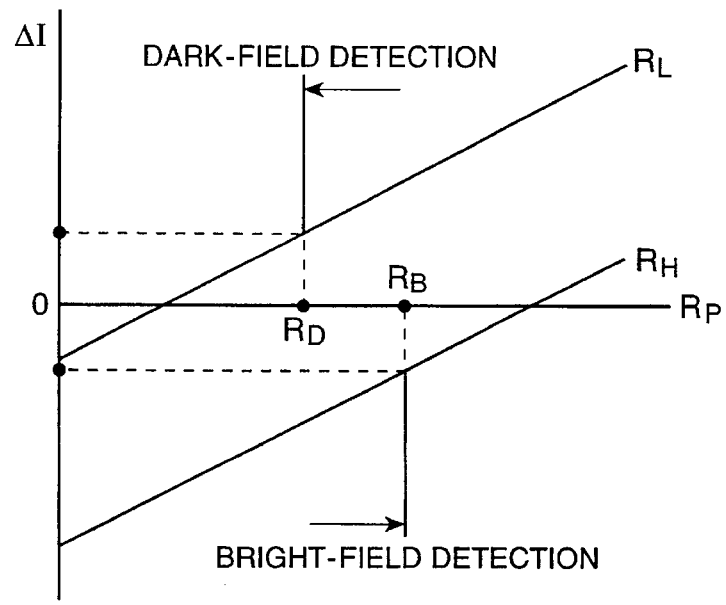
FIG. 6 is a graph useful for explaining the mark detecting operation.
Figure 7:
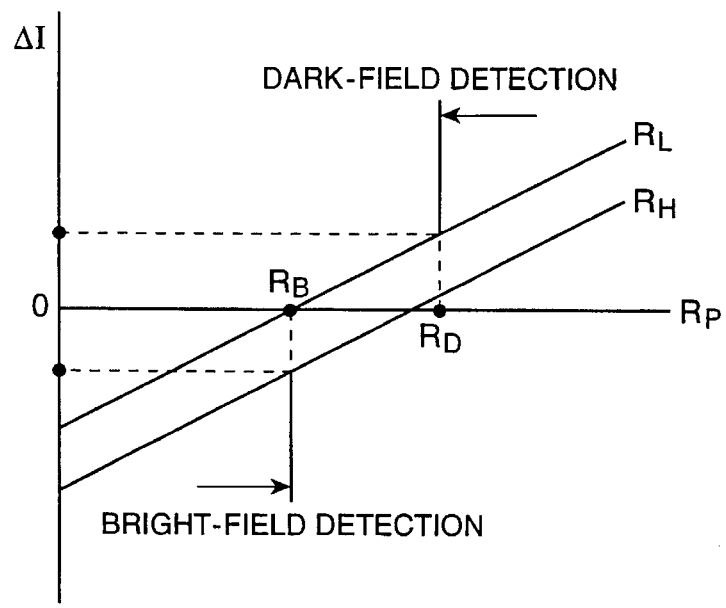
FIG. 7 is another graph useful for explaining the mark detecting operation.

On the other hand, f $R_P$ represents the reflection of the mark 1a, the light intensity $I_P$ of the detected image due to the reflected light from the mask mark 1a of the mask 1 is given by the following $$I_P = [R_G + (1-R_G)^2 \cdot R_P] \cdot I_O$$

Where the image detection is effected by using an ITV (industrial television camera) as the detector 9, it is necessary that the intensity difference $\Delta I = I_P - I_B$ between the light intensity $I_B$ of the background and the light intensity $I_P$ of the detected images must be greater than a certain value. FIG. 6 is a graph in which the abscissa represents the reflectance $R_P$ of the mask mark 1a, the ordinate represents the intensity difference $\Delta I$, $R_H$ represents the reflectance of the high reflectance surfaces and $R_L$ represents the reflectance of the low reflectance surfaces, thereby determining the time of change-over between the different reflective surfaces. In the graph, the dotted lines show the minimum limit intensity differences required for the image detection by use of the ITV. In other words, in the condition where the intensity difference $\Delta I$ is held between the dotted lines, the ITV cannot make a distinction between the background and the detected image. In the case of FIG. 6, the dark-field detection by use of the low reflectance surfaces can be effected when the reflectance of the mask is higher than the value of $R_D$, whereas the bright-field detection by use of the high reflectance surfaces can be effected when the reflectance of the mask is lower than the value of $R_B$. As a result where the reflectance of the mask marks of the mask 1 is between $R_D$ and $R_B$, it is only necessary to select the reflective surfaces of the type that ensures a greater intensity difference $\Delta I$, although the detection is possible by either of the reflective surfaces of the two types.

Where the reflectance of the high reflectance surfaces is not so high, however, there exists a certain range of values for the mask reflectance $R_P$ which makes it impossible to effect both the dark-field detection and the bright-field detection as shown in FIG. 7. In other words, where the reflectance of the marks of the mask 1 is between $R_D$ and $R_B$ in FIG. 7, the detection is impossible by either one of the two types of reflective surfaces.

From the foregoing it will be seen that in order to make it possible to detect the mask marks of the mask 1 irrespective of the reflectance, it is desirable that if $I_D$ represents the minimum intensity difference required for distinguishing the detected image from the background by the ITV, the following relation holds between the reflectance $R_H$ of the high reflectance surfaces and the reflectance $R_L$ of the low reflectance surfaces $$(1-R_G)^4 \cdot T^2 \cdot (R_H - R_L) \geq I_D/I_O$$

Due to the existance of such relation, the difference between the reflectance $R_H$ of the high reflectance surfaces and the reflectance $R_L$ of the low reflectance surfaces should preferably be as large as possible. Further, in consideration of the facts that the sensitivity of the television camera is not high in the ultraviolet region such as the i line, that the light quantity usable for alignment purposes is not so large and that the transmittance of the projection optical system 3 cannot be increased due to the use of a single-wavelength exposure light, it is more preferable that the difference between the reflectance $R_H$ of the high reflectance surfaces and the reflectance $R_L$ of the low reflectance surfaces of the fiducial plate 11 is as large as possible. With the low reflectance surfaces, the reflectance $R_L$ can be reduced to a value which substantially corresponds only to the surface reflection at the mask 1 to permit the transmission of light and practically this value becomes the lower limit. In the case of the high reflectance surfaces, however, the reflectance can be improved by suitably selecting a substance to be deposited by evaporation. As regards the exposure light (the ultraviolet light, particularly the g line or the i line), such material as aluminum should preferably be used as one having a high reflectance.

Also, while the switching between the bright field and the dark field in accordance with the reflectance of the mask marks (1ax, 1ay, 1aθ) may be effected automatically as mentioned previously, it is possible to preliminarily store the reflectance of the mask marks (1ax, 1ay, 1aθ) so as to effect the change-over between the bright field and the dark field in accordance with the stored data. As example of the change-over between the bright field and the dark field according to the stored data will now be described in detail as a third embodiment of the present invention with reference to FIG. 8.

Figure 8:
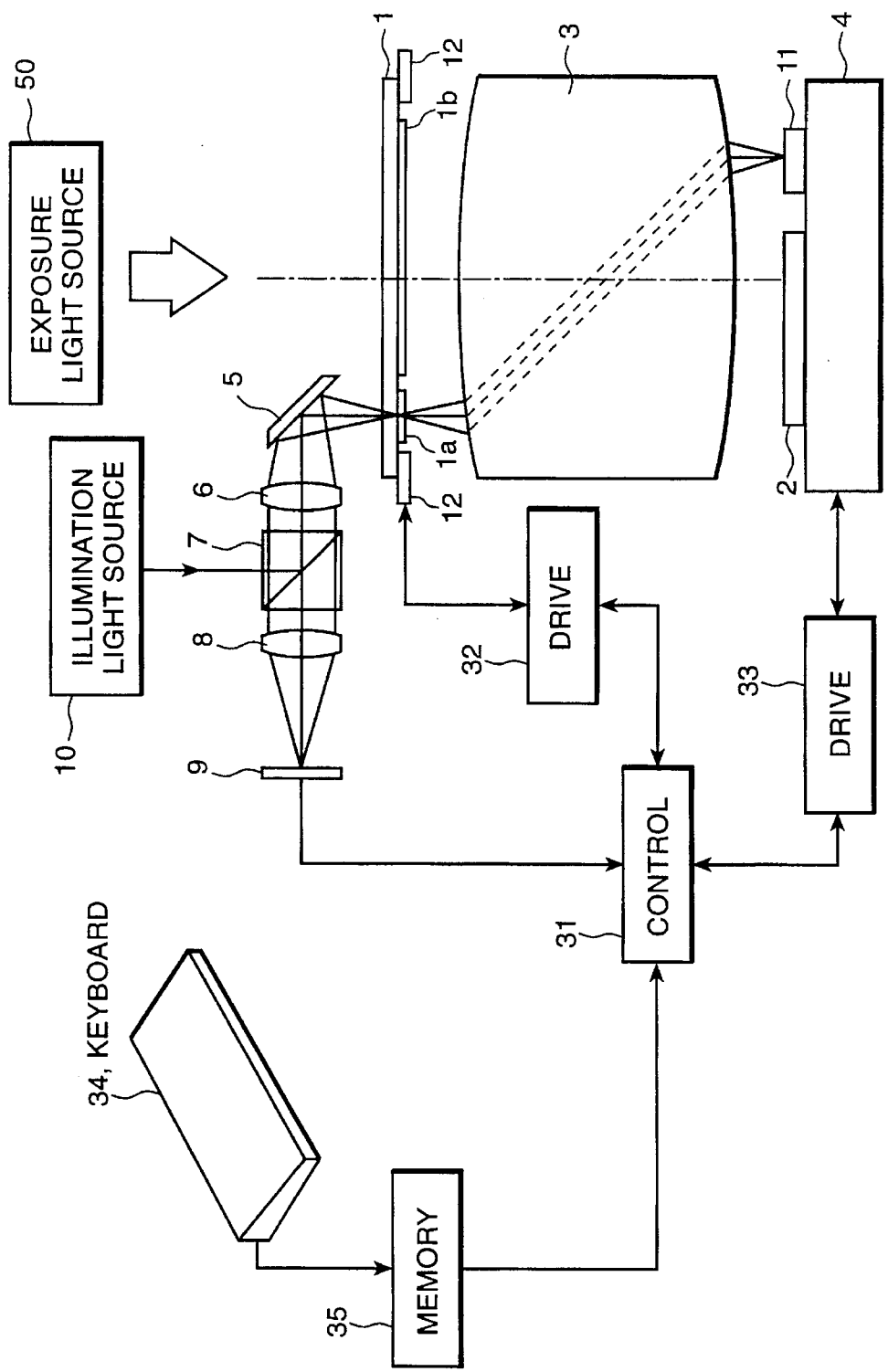
FIG. 8 shows the construction of principal parts of a third embodiment of the position detecting apparatus, which is applied to an exposure apparatus.

Note that for the purpose of simplifying the description, in FIG. 8 the component parts having the same functions as in the second embodiment shown in FIG. 2 are designated by the same reference numerals. Also, the third embodiment differs from the second embodiment in that there are additionally provided a keyboard 34 for entering the reflectance data of the mask marks and a memory 35 for storing the output from the keyboard 34.

Firstly, the information concerning the reflectances of the mask marks (1ax, 1ay, 1aθ) of masks to be exposed are entered in the order of exposure of the masks by use of the keyboard 34. Then, the keyboarded information concerning the reflectances of the mask marks are stored in the memory 35.

Then, when replacing the mask with a new mask 1 containing a circuit pattern 1b which is to be exposed onto the wafer 2, in accordance with the information concerning the reflectance of the mask stored in the memory 35 the control system 31 operates the drive system 33 so as to move the wafer stage 4 in such a manner that one or the other of the high reflectance surfaces 15x, 15y and 15θ and the low reflectances surfaces 14x, 14y and 14θ are respectively positioned within the visual fields of the mask alignment systems.

In other words, if the reflectance of the mask marks (1ax, 1ay, 1aθ) is low, the high reflectance surfaces 15x, 15y and 15θ are positioned within the visual fields of the respective mask alignment systems. On the contrary, if the reflectance of the mask marks (1ax, 1ay, 1aθ) is high, the low reflectance surfaces 14x, 14y and 14θ are positioned within the visual fields of the respective mask alignment systems.

While, in this embodiment, the keyboard 34 is provided as a means of entering the reflectance information of the mask marks, this input means is not limited to the keyboard and it may be comprised of a so-called mouse, display touch sensor or any other like means. In addition, instead of inputting the reflectance information of the mask marks, the mask mark detection method (selection of the bright-field detection or the dark-field detection) for the mask to be exposed may be inputted or alternatively the information indicating whether a reflection reducing coating is applied to the mask to be exposed may be entered.

Also, it is possible to employ a construction in which the mask itself is stamped with information concerning the reflectance of the mask marks and a detector for detecting the stamped information is provided thereby applying the detected information from the detector to the control system. Further, it is possible to employ a construction in which as for example, reflectance detecting means for directly detecting the reflectance of the mask marks is provided in the vicinity of the mask stage 12 to apply the detected information to the control system.

Still further, while, in the second embodiment shown in FIG. 2, either the low reflectance surfaces or the high reflectance surfaces are positioned within the visual fields of the respective alignment systems in accordance with the reflectance of the mask marks, as in the case of the first embodiment shown in FIG. 1, the reflective surfaces may be replaced with a variable reflectance mirror so as to adjust the reflectance of the variable reflectance mirror in accordance with the reflectance of the mask marks. An exemplary case of adjusting the brightness of a background light by use of a variable reflectance mirror will now be described as a fourth embodiment of the present invention in detail with reference to FIG. 9.

Figure 9:
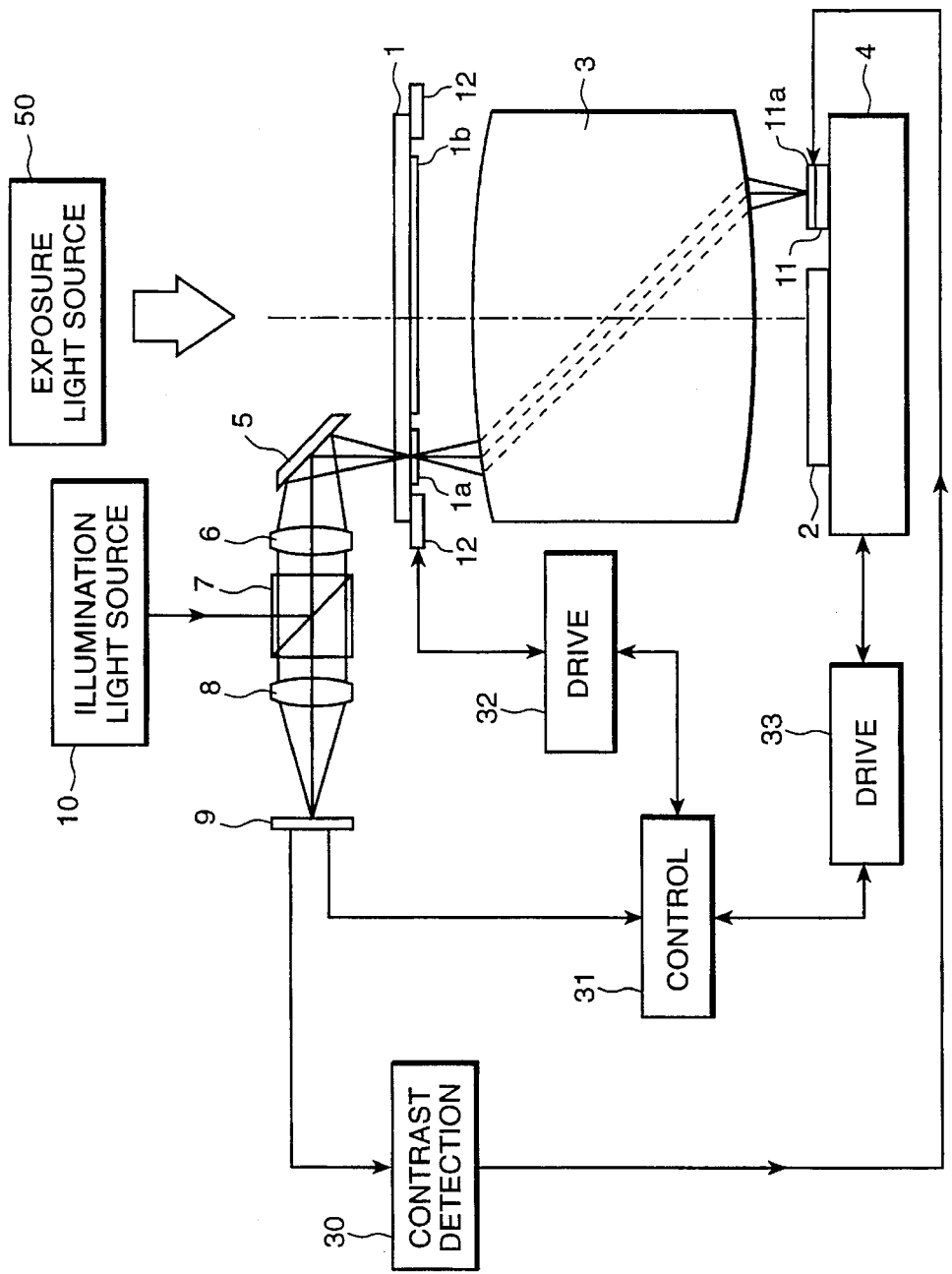
FIG. 9 shows the construction of principal parts of a fourth embodiment of the position detecting apparatus, which is applied to an exposure apparatus.

It is to be noted that in FIG. 9 the component members having the same functions as in the second embodiment shown in FIG. 2 are designated by the same reference numerals for the purpose of simplifying the description. Also, the fourth embodiment differs from the second embodiment in that a variable reflectance mirror 11a is provided on the fiducial plate 11 and reflectance of the variable reflectance mirror 11a is varied by the contrast detection system 30 for detecting the contrast of the images of the marks 1a formed on the detectors 9.

In FIG. 9, the control system 31 measures the positions of the mask marks (1ax, 1ay, 1aθ) in accordance with the output signals from the detectors 9 for detecting the images of the marks 1a. Then, in accordance with the positions of the measured mask marks (1ax, 1ay, 1aθ), the control system 31 operates the drive system 32 to move the mask stage 12 in such a manner that the mask 1 is placed in a given position for exposure purposes.

Also, the variable reflectance mirror 11a is attached onto the fiducial plate 11 provided on the wafer stage 4. As in the case of the first embodiment shown in FIG. 1, the variable reflectance mirror 11a is prepared by attaching an electrochromic element to the surface of a planar mirror. In response to the electric signal from the contrast detection system 30, the variable reflectance mirror 11a changes the light transmittance of the electrochromic element to vary its reflectance.

The contrast detection system 30 detects the contrast between the images of the mask marks and the background light received through the variable reflectance mirror 11a. When the condition of the contrast is not fully satisfactory, the contrast detection system 30 changes the reflectance of the variable reflectance mirror 11a.

Thus, when the reflectance of the mask marks is high, that is, when the detectors 9 detect the bright images of the mask marks, the contrast detection system 30 reduces the reflectance of the variable reflectance mirror 11a to decrease the brightness of the background light. On the contrary, when the reflectance of the mask marks is low, that is, when the detectors 9 detect the dark images of the mask marks, the contrast detection system 30 increases the reflectance of the variable reflectance mirror 11a to increase the brightness of the background light. In this way, it is possible to vary the reflectance of the variable reflectance mirror 11a so as to always detect the images of the mask marks which are excellent in contrast.

It is to be noted that even in cases where the variable reflectance mirror is used, it may be designed so that as in the case of the third embodiment shown in FIG. 8, the reflectance of the mask marks (1ax, 1ay, 1aθ) is preliminarily stored so as to effect the change-over between the bright field and the dark field in accordance with the stored data. An exemplary case of adjusting the reflectance of the variable reflectance mirror in accordance with the stored data will now be described as a fifth embodiment in detail with reference to FIG. 10.

Figure 10:
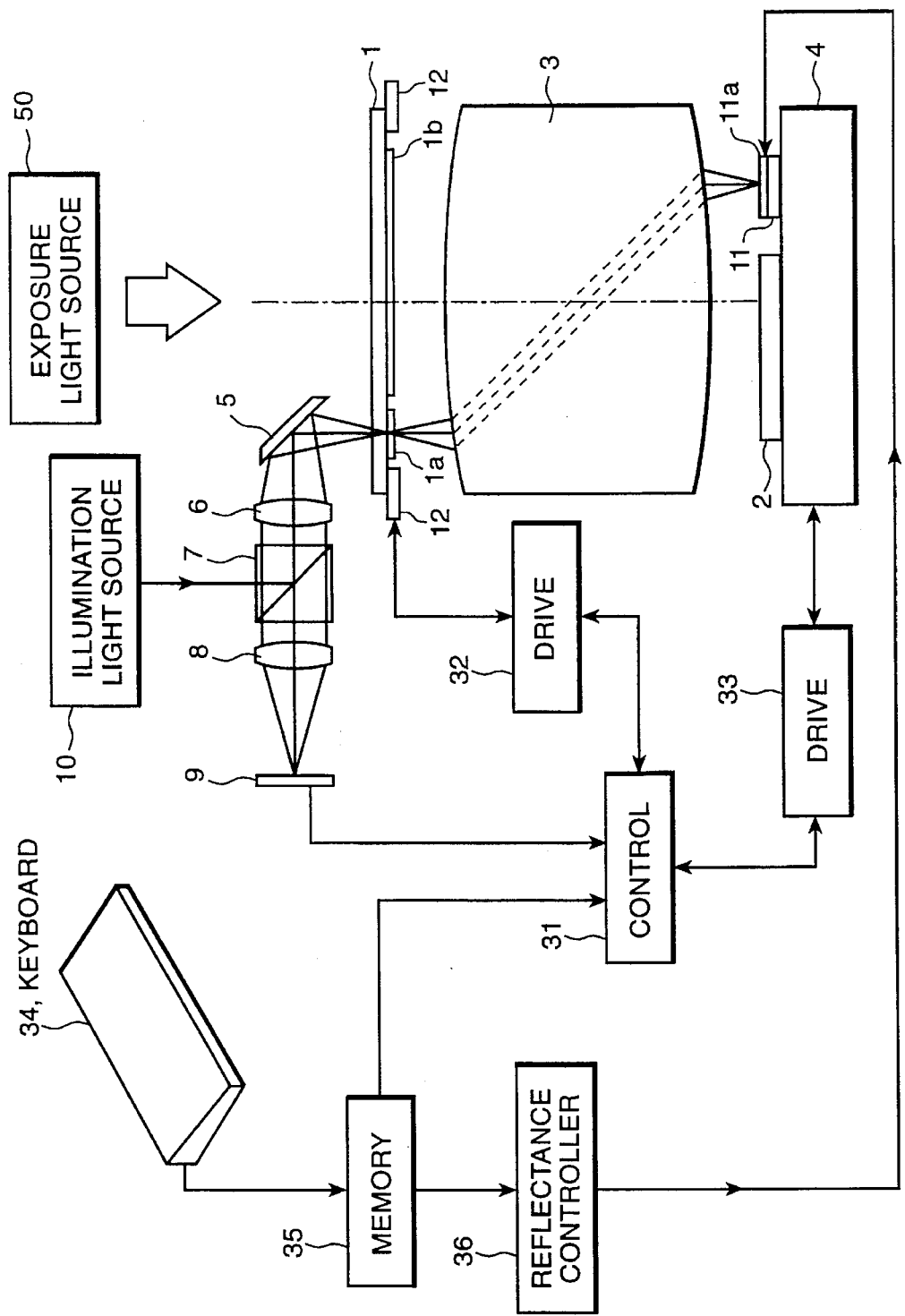
FIG. 10 shows the construction of principal parts of a fifth embodiment of the position detecting apparatus, which is applied to an exposure apparatus.

Note that in FIG. 10 the same component members having the same functions as in the previously mentioned third embodiment shown in FIG. 8 are designated by the same reference numerals for the purpose of simplifying the description. The fifth embodiment differs from the third embodiment in that the variable reflectance mirror 11a is attached onto the fiducial plate 11 and the reflectance of the variable reflectance mirror 11a is varied by a reflectance controller 36 in accordance with the information concerning the reflectance of the mask stored in the memory 35.

In the first place, the reflectance information of masks to be exposed are preliminarily entered in the order of their exposure by use of the input unit or the keyboard 34 and the entered reflectance information of the masks are stored in the memory 35.

When the mask 1 is transferred to and set on the mask stage 12 by the function of the-exposure apparatus, in accordance with the reflectance information of the mask stored in the memory 35 the reflectance of the variable reflectance mirror 11a is varied by the reflectance controller 36 for effecting the change-over control on the reflectance of the variable reflectance mirror 11a in such a manner that the images of the mask marks detected by the detectors 9 are improved in contrast.

At this time, the reflectance information of the mask stored in,the memory 35 is also transmitted to the control system 31. In accordance with the reflectance information of the mask the control system 31 determines whether the mask marks must be subjected to the bright-field detection or the dark-field detection so that the signal processing method for the mask marks images to be outputted from the detectors 9 is changed to conform with the thus determined detection method.

Next, an exemplary case in which the position detecting apparatus according to the present invention is used with a projection exposure apparatus, that is, the position detecting apparatus is used in parallel with the wafer position detecting optical system of the exposure apparatus thereby effecting the mark position detection will now be described as a sixth embodiment with reference to FIG. 11.

Figure 11:
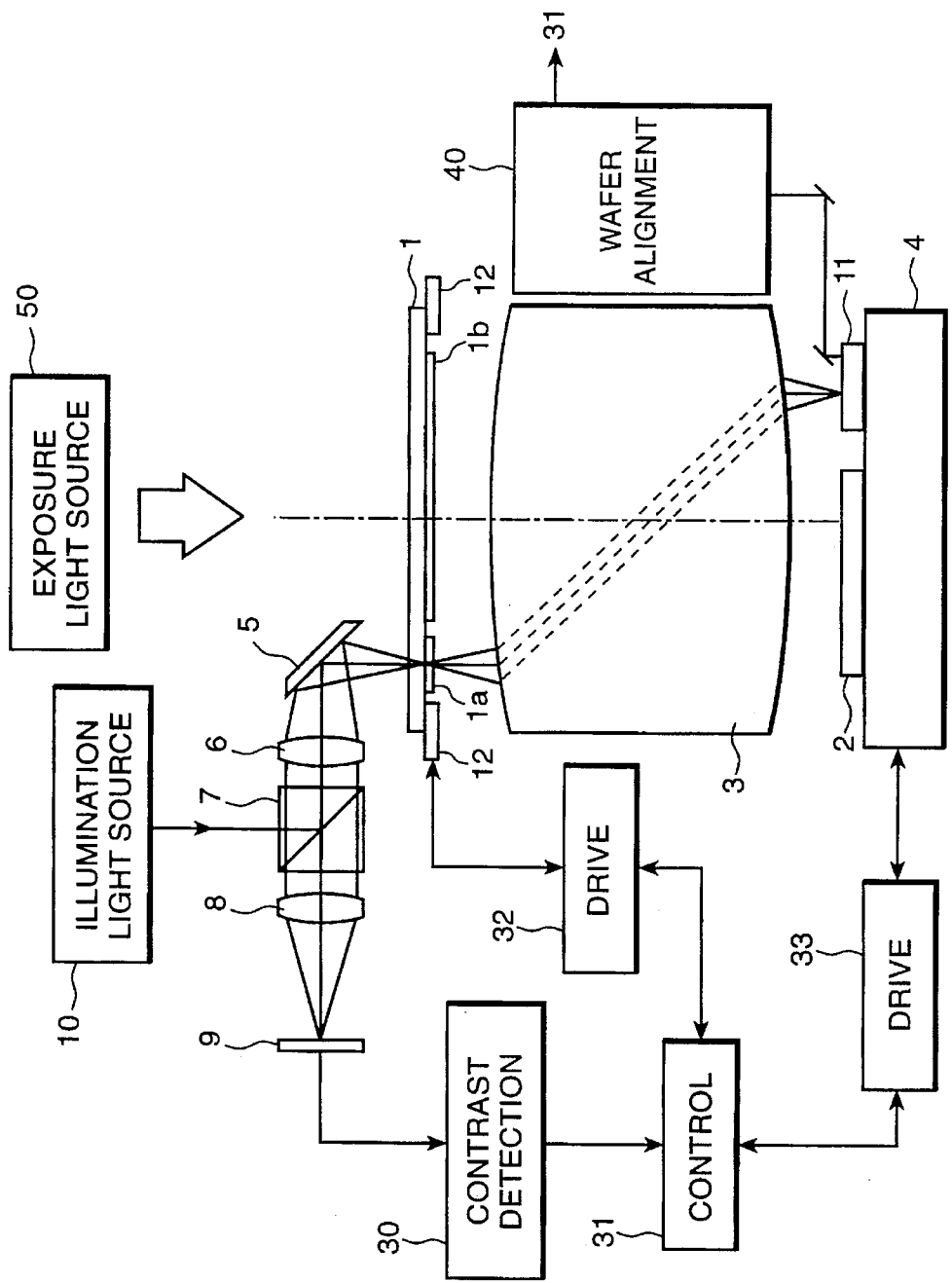
FIG. 11 shows the construction of principal parts of a sixth embodiment of the position detecting apparatus, which is applied to an exposure apparatus.

Note that in FIG. 11 the component members having the same functions as the second embodiment shown in FIG. 2 are designated by the same reference numerals for the purpose of simplifying the description. Also, the sixth embodiment differs from the second embodiment in that there is provided a wafer position detecting optical system (wafer alignment system) 40 for optically detecting the position of a wafer.

This wafer position detecting optical system 40 means one which is provided in parallel to the projection optical system 3 to photoelectrically detect the images of the wafer alignment fiducial marks formed on the fiducial plate 11 and the wafer alignment marks formed on the wafer 2 or another which detects these fiducial marks and wafer alignment marks by an optical technique such as the scanning by a laser beam.

Figure 12:
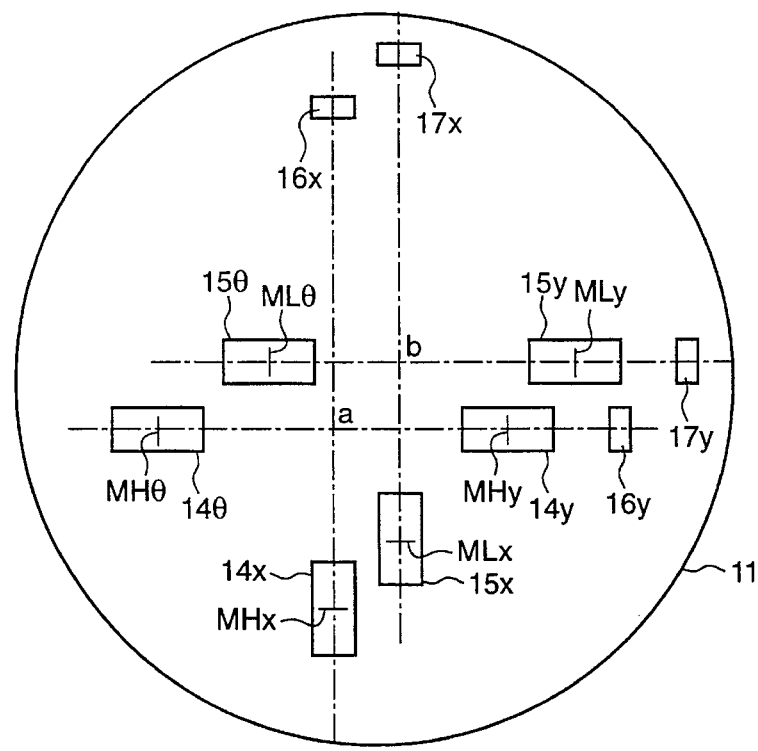
FIG. 12 is a schematic plan view of the fiducial plate with fiducial marks.

Also, the mask 1 loaded on the mask stage 12 is the same as the previously mentioned mask shown in FIG. 3 and the mask 1 is formed with mask marks 1ax, 1ay and 1aθ for respectively detecting its positions in the mutually perpendicular x and y directions and the θ rotational direction. In correspondence to these marks 1ax, 1ay and 1aθ, the fiducial plate 11 is formed with low reflectance surfaces 14x, 14y and 14θ and high reflectance surfaces 15x, 15y and 15θ as shown in FIG. 12.

Then, in order to detect the relative positions of the mask marks 1ax, 1ay and 1aθ and the fiducial plate 11 on the wafer stage 4, the low reflectance surfaces 14x, 14y and 14θ are respectively formed with high reflectance fiducial marks MHx, MHy and MHθ and the high reflectance surfaces 15x, 15y and 15θ are respectively formed with low reflectance fiducial marks MLx, MLy and MLθ.

In addition, in order to permit the wafer alignment reference position measurement operation by the wafer position detecting optical system 40 simultaneously with the mask alignment by the detecting systems (5 to 10) even if the change-over between the low reflectance surfaces 14x, 14y and 14θ and the high reflectance surfaces 15x, 15y and 15θ has been effected, additional two pairs of wafer alignment fiducial marks including fidual marks 16x and 16y used at the time of selecting the low reflectance surfaces and fiducial marks 17x and 17y used at the time of selecting the high reflectance surfaces are respectively arranged so as to be apart-by a predetermined mark spacing from each other and thereby to be positioned within the visual field (detection range) of the wafer position detecting optical system 40.

It is to be noted that the difference in reflectance between the low reflectance surfaces 14x, 14y and 14θ and the high reflectance fiducial marks MHx, MHy and MHθ respectively formed on the surfaces of the former and the difference in reflectance between the high reflectance surfaces 15x, 15y and 15θ and the low reflectance fiducial marks MLx, MLy and MLθ respectively formed on the surfaces of the former should preferably be as large as possible as in the case of the difference in reflectance between the low reflectance surfaces and the high reflectance surfaces in the second embodiment.

In the present embodiment, the alignment of the mask 1 is effected by the mask position detecting systems (5 to 10) and the alignment of the wafer 2 is effected by the wafer position detecting optical system 40. While, during the actual exposure, the wafer position detecting optical system 40 detects the wafer alignment marks provided on the periphery of the exposure or shot area of the wafer 2, it is preferable that at this time the amount of positional error between the center point of the projection optical system 3 (the intersection of the optical axis Ax of the projection optical system 3 and the wafer 2) and the detected reference point of the wafer position detecting optical system 40, that is, the amount of base line is measured pleriminarily.

More specifically, firstly the positions of the mask fiducial marks MHx and MHy are detected by use of the mask position detecting systems (5 to 10) and the amounts of positional errors with respect to the mask marks 1ax and 1ay are measured thereby determining the center point of the projection optical system 3. Then, the wafer position detecting optical system 40 is used to detect the positions of the wafer alignment fiducial marks 16x and 16y and thereby to measure the amounts of positional errors with respect to the detected reference point of the wafer position detecting optical system 40. Thereafter, in accordance with both of these measured amounts of positional errors and the design distance values between the fiducial marks (MHx, MHy) and (16x and 16y) on the fiducial plate 11, the relative distance between the actual center point of the projection optical system 3 and the detected reference point of the wafer position detecting optical system 40 is calculated. This relative distance is the amount of base line.

After the measurement of the amount of base line has been completed in this way, the control system 31 drives the drive system 33 into operation to move the wafer stage 4 in such a manner that the area of the wafer 2 to be exposed is positioned in the exposure area of the projection optical system 3. Thereafter, the circuit pattern 1b of the mask 1 is projected and exposed onto the wafer 2 by the exposure light from the exposure light source 50. During this projection exposure period, the wafer position detecting optical system 40 detects the positions of the wafer marks provided around the area of the wafer 2 to be exposed. Then, in accordance with the measured values of the detected wafer marks the control system 31 offsets the previously mentioned amount of base line to obtain the accurate position of the wafer 2. Thus, in accordance with the present embodiment the matching between the alignments of the mask 1 and the wafer 2 is ensured during the actual exposure.

As described hereinabove, by virtue of the construction of the sixth embodiment, there is no need to move the wafer stage 4 during the measurement of the amount of base line so that not only the effect of any feed error of the wafer stage 4 is overcome but also the measurement of the amount of base line can be effected simultaneously with the mask alignment.

It is to be noted that the changing of the background light for the mask alignment is the same as the second embodiment and its explanation will be omitted. Also, as regards the changing of the background light, as shown in the third embodiment, the technique of storing data concerning the reflectances of mask marks to be exposed successively in the memory by input means or the like may be used. Further, the method of stamping information concerning the reflectance of mask marks on a mask itself so as to detect the stamped information as well as the technique of directly measuring the reflectance of the mask marks themselves may be employed.

Figure 13:
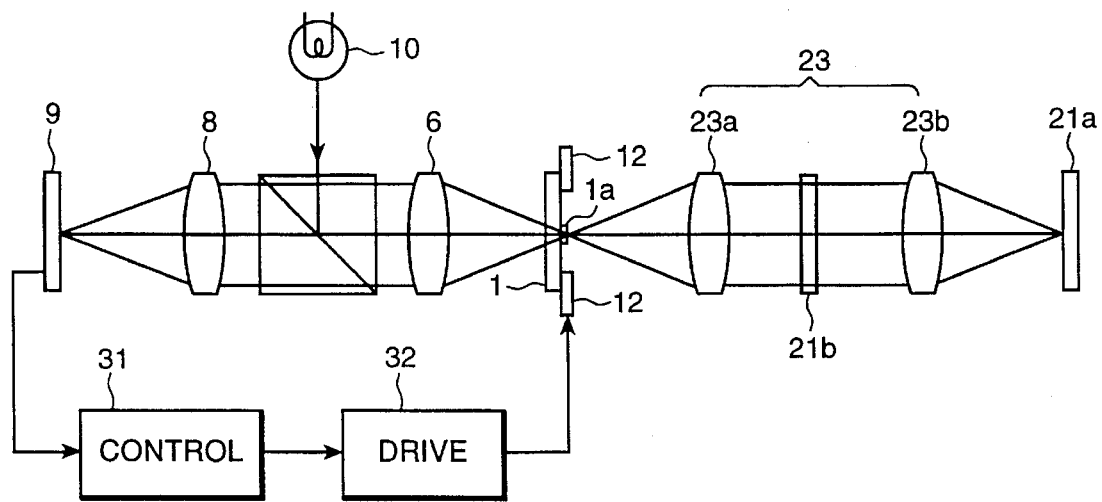
FIG. 13 shows the construction of prineiapl parts of a position detecting apparatus according to a seventh embodiment of the present invention.

Now, an example of the position detecting apparatus according to the present invention in which optical means for arranging a mark and reflecting means in a conjugate relation is provided with a variable light transmittance so as to adjust the brightness of the background light of the mark will now be described as a seventh embodiment with reference to FIG. 13. Note that in FIG. 13 the component members having the same functions as in the first embodiment (FIG. 1) are designated by the same reference numerals.

The seventh embodiment shown in FIG. 3 differs from the first embodiment in that a projection optical system 23 is comprised of positive lenses 23a and 23b to serve as the optical means for arranging the mark 1a and a reflective surface 21a and a variable transmittance member 21b for varying the light transmittance is arranged between the positive lenses 23a and 23b or within the projection optical system. It is to be noted that the variable transmittance member 21b should preferably be made for example of an electrochromic device, a liquid crystal device, two polarizing plates which are relatively rotatable or an electro-optical device (e.g., Kerr cell).

In accordance with the present embodiment, the transmittance of the variable transmittance member 21b can be varied to adjust the brightness of the background light. At this time, by changing the transmittance of the variable transmittance member 21b to the optimum condition in accordance with the reflectance of the mark 1a of the object 1 to be detected, it is possible to always detect the position of the mark 1a with a high degree of accuracy.

While, in this embodiment, the variable transmittance member 21b is provided within the projection optical system 23, the present invention is not limited thereto and it is only necessary as a matter of principle that the variable transmittance member 21b is arranged between the object 1 to be detected and the reflective surface 21a.

What is claimed is:

1. An apparatus for optically detecting a position of a mark provided on an object to be detected, said apparatus comprising:

light source means for supplying light;

an illumination optical system for directing the light from said light source means to said mark to illuminate said mark;

reflecting means having a predetermined reflectance;

optical means for projecting the light passed around said mark to form a first image of said mark onto said reflecting means;

said mark and said reflecting means being arranged in a conjugate relation with respect to said optical means so as to superpose a second image of said mark produced by the light which is returned as the result of the reflection from said reflecting means in a coincident condition with said mark; and detecting means for detecting a reflection image of said mark in accordance with first light which is directly reflected from said mark illuminated by said illumination optical system and second light which is reflected from said reflecting means and passed through said optical means and around said mark.

2. An apparatus according to claim 1, wherein said optical means includes variable transmittance means for adjusting a quantity of light passed through said optical means.

3. An apparatus according to claim 2, wherein said variable transmittance means is adapted to adjust the quantity of light passed through said optical means in accordance with a difference in intensity between said first and second light.

4. An apparatus according to claim 1, wherein said reflecting means includes variable reflectance means for adjusting a reflectance of said reflecting means.

5. An apparatus according to claim 4, wherein said variable reflectance means is adapted to adjust the reflectance of said reflecting means in accordance with a difference in light quantity between said first and second light.

6. An apparatus according to claim 1, further comprising moving means for moving said reflecting means relatively to said object, wherein said reflecting means includes a plurality of reflective surfaces which are different in reflectance from each other, and wherein said moving means is responsive to a detection signal from said detecting means to move said reflecting means in order to position one of said plurality of reflective surfaces within a detection visual field of said detecting means.

7. An apparatus according to claim 1, wherein said reflecting means includes a first reflective surface having a predetermined reflectance and a second reflective surface different in reflectance from said first reflective surface, and wherein said reflecting means satisfies the following $$(1-R_G)^4 \cdot T^2 \cdot (R_H - R_L) \geq I_D/I_O$$

where $R_H$ is the reflectance of said first reflective surface, $R_L$ is the reflectance of said second reflective surface, $R_G$ is the reflectance of said object, T is the transmittance of said optical means, $I_O$ is the intensity on said mark of said light from said illumination optical system, and $I_D$ is the minimum difference in intensity between said first and second light which is detectable by said detecting means.

8. An exposure apparatus for projecting an image of a pattern formed on a mask onto a surface of a wafer through a projection optical system, said apparatus comprising:

a mask stage for supporting said mask;

a wafer stage for supporting said wafer;

an illumination optical system including a light source for directing light from said light source to a given mark on said mask to illuminate the given mark;

a reflecting member mounted on said wafer stage;

a detection optical system having a predetermined visual field;

said reflecting member being provided with a first reflective surface region and a second reflective surface region which are different in reflectance and in location from each other;

said first reflective surface region and said second reflective surface region being arranged in a conjugate relation with respect to said given mark; and said wafer stage being adapted to be movable in order to locate one of said first reflective surface region and said second reflective surface region in said visual field of said detection optical system.

9. An exposure apparatus for projecting an image of a pattern formed on a mask onto a surface of a wafer through a projection optical system, said apparatus comprising:

a mask stage for supporting said mask;

a wafer stage for supporting said wafer;

an illumination optical system including a light source for directing light from said light source to a given mark on said mask to illuminate the given mark;

a reflecting member mounted on said wafer stage;

a detection optical system having a predetermined visual field; and said reflecting member being arranged in a conjugate relation with respect to said mark and adapted to vary reflectance thereof.

10. A method for projecting an image of a pattern formed on a mask onto a surface of a wafer through a projection objective lens, said method comprising the steps of:

supplying an illumination light to a given mark on said mask;

introducing said illumination light to a reflecting member located in a position conjugate to said mark through said objective lens;

introducing a first light reflected from said reflecting member and a second light reflected from said mark to a detector; and aligning said mask to a predetermined position on the basis of a detection output from said detector, changing reflectance of said reflecting member in accordance with reflectance of said mark.

11. A method according to claim 10, wherein said reflecting member has a first reflective surface region and a second reflective surface region which are different in reflectance and in location from each other, and wherein said step of changing reflectance includes a step of moving said reflecting member so as to locate one of said first reflective surface region and said second reflective surface region in a visual field of said detector.

12. A method according to claim 10, wherein said step of changing reflectance includes providing said reflecting member with a variable reflectance and varying said reflectance of said reflecting member.

* * * * *